(12) United States Patent
Kobayashi et al.

(10) Patent No.: US 8,842,257 B2
(45) Date of Patent: *Sep. 23, 2014

(54) SUBSTRATE TREATMENT METHOD, SUBSTRATE TREATMENT APPARATUS, AND NON-TRANSITORY COMPUTER STORAGE MEDIUM

(75) Inventors: Shinji Kobayashi, Nirasaki (JP); Fumiko Iwao, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 169 days.

This patent is subject to a terminal disclaimer.

(21) Appl. No.: 13/401,953

(22) Filed: Feb. 22, 2012

(65) Prior Publication Data

US 2012/0225390 A1 Sep. 6, 2012

(30) Foreign Application Priority Data

Mar. 3, 2011 (JP) ................. 2011-046735

(51) Int. Cl.
*G03B 27/14* (2006.01)
*H01L 21/677* (2006.01)
*H01L 21/67* (2006.01)

(52) U.S. Cl.
CPC .... *H01L 21/67103* (2013.01); *H01L 21/67748* (2013.01)
USPC .............. 355/30; 430/432; 430/427

(58) Field of Classification Search
CPC ......... G03F 7/40; G03F 7/42; G03F 7/70733; G03F 7/70716; G03F 7/70725
USPC ..................... 355/30; 430/432, 427
See application file for complete search history.

(56) References Cited

U.S. PATENT DOCUMENTS

| 5,201,960 | A  | * | 4/1993 | Starov .............. 134/11 |
| 6,514,073 | B1 | * | 2/2003 | Toshima et al. ........ 432/85 |
| 2012/0225389 | A1 | * | 9/2012 | Kobayashi ........... 430/432 |

FOREIGN PATENT DOCUMENTS

| JP | B2-4328667 | 6/2009 |
| JP | B2-4343018 | 7/2009 |

* cited by examiner

Primary Examiner — Daborah Chacko Davis
(74) Attorney, Agent, or Firm — Posz Law Group, PLC

(57) ABSTRACT

A substrate treatment method of performing treatment on a substrate on which a pattern mask has been formed by exposure and developing treatment to improve roughness of the pattern mask includes the processes of: mounting the substrate on a stage in a treatment container; and repeating a plurality of times steps of supplying a solvent gas to a center portion of the substrate while exhausting the solvent gas from a periphery of the substrate to swell the pattern mask, and then supplying a drying gas for drying the solvent supplied to the substrate to the center portion of the substrate while exhausting the drying gas from the periphery of the substrate.

9 Claims, 18 Drawing Sheets

SUBSTRATE TREATMENT METHOD, SUBSTRATE TREATMENT APPARATUS, AND NON-TRANSITORY COMPUTER STORAGE MEDIUM

BACKGROUND OF THE INVENTION

1. Field of the Invention

The present invention relates to a substrate treatment method, a substrate treatment apparatus, and a non-transitory computer storage medium each for improving roughness of a pattern mask.

2. Description of the Related Art

Due to the wave properties of light applied to a resist film on a wafer during exposure processing, variation in measured dimension called LWR (Line Width Roughness) occurs in a resist pattern formed after development. If a base film is etched using the resist film having the rough pattern as described above as a mask, the etching shape is affected by the roughness, with the result that a circuit pattern formed by the etching becomes rough in shape and possibly fails to manufacture a semiconductor device with a desired quality.

Hence, it is discussed to expose the resist pattern in a solvent atmosphere to swell and dissolve its surface to thereby smooth the surface of the resist pattern. For example, Japanese Patent Publication No. 4343018 describes, as an apparatus performing such treatment, a substrate treatment apparatus which includes a chuck sucking the wafer, a nozzle supplying a vaporized solvent from above the wafer, a moving mechanism moving the nozzle along a radial direction of the wafer, and a cup body surrounding the side circumference of the wafer and exhausting the inside thereof. However, provision of the cup body and the moving mechanism for the nozzle in the substrate treatment apparatus leads to an increase in footprint of the substrate treatment apparatus and an increase in manufacturing cost of the substrate treatment apparatus.

Hence, it is discussed to improve the roughness of the resist pattern using a substrate treatment apparatus including a treatment container storing a wafer, a discharge port provided at the treatment container, and a supply mechanism supplying a vaporized solvent from the discharge port. However, a problem of the substrate treatment apparatus is that it is difficult to perform treatment with high uniformity within the wafer.

Concretely describing the problem, the vaporized solvent flows on the wafer surface while adhering to the wafer, so that the supply amount of the solvent is larger near the discharge port than at a position away from the discharge port. Further, variation in flow speed of the vaporized solvent occurs within the wafer due to the arrangement of the discharge port and an exhaust port provided at the treatment container to cause a difference in concentration distribution and a place where the proportion of molecules of the solvent colliding with the wafer is higher. This possibly makes the resist pattern excessively swell to fall down or dissolve. In particular, when the line width of the resist pattern is made smaller in order to form a fine circuit pattern in the base film, the ratio of a thickness area where the solvent permeates to the thickness of the pattern becomes larger, and therefore the falling and dissolution of the pattern are thought to become likely to occur. On the other hand, at the position of the wafer away from the discharge port and at a position where the proportion of collision is small due to the variation in flow speed, the solvent cannot sufficiently eliminate in some cases the roughness of the resist pattern because the supply amount is small.

Japanese Patent Publication No. 4343018 describes repeated supply of the solvent with the supply direction changed but does not describe the method to solve the above-described problem. Further, Japanese Patent Publication No. 4328667 also describes a substrate treatment apparatus which supplies a vaporized solvent from a nozzle but does not describe the method to solve the problem.

SUMMARY OF THE INVENTION

The present invention is made under such circumstances and its object is to provide a technique capable of preventing dissolution of a pattern mask formed on a substrate and uniformly smoothing the surface of the pattern mask within the substrate.

A substrate treatment method of the present invention is a substrate treatment method of performing treatment on a substrate on which a pattern mask has been formed by exposure and developing treatment to improve roughness of the pattern mask, the method including the processes of:

mounting the substrate on a stage in a treatment container; and repeating a plurality of times steps of supplying a solvent gas to a center portion of the substrate while exhausting the solvent gas from a periphery of the substrate to swell the pattern mask, and then supplying a drying gas for drying the solvent supplied to the substrate to the center portion of the substrate while exhausting the drying gas from the periphery of the substrate.

Another substrate treatment method of the present invention is a substrate treatment method of performing treatment on a substrate on which a pattern mask has been formed by exposure and developing treatment to improve roughness of the pattern mask, the method including the processes of:

mounting the substrate on a stage in a treatment container; and repeating a plurality of times steps of supplying a solvent gas to a periphery of the substrate while exhausting the solvent gas from above a center portion of the substrate to swell the pattern mask, and then supplying a drying gas for drying the solvent supplied to the substrate to the periphery of the substrate while exhausting the drying gas from above the center portion of the substrate.

Still another substrate treatment method of the present invention is a substrate treatment method of performing treatment on a substrate on which a pattern mask has been formed by exposure and developing treatment to improve roughness of the pattern mask, the method including the processes of:

mounting the substrate on a stage in a treatment container; and repeating a plurality of times steps of supplying a solvent gas to one end side of the substrate while exhausting the solvent gas from another end side of the substrate to swell the pattern mask, and then supplying a drying gas for drying the solvent supplied to the substrate to the one end side of the substrate while exhausting the drying gas from the another end side of the substrate.

A substrate treatment apparatus of the present invention is a substrate treatment apparatus for performing treatment on a substrate on which a pattern mask has been formed by exposure and developing treatment to improve roughness of the pattern mask, the apparatus including:

a treatment container;

a stage provided in the treatment container;

a solvent gas supply part for supplying a solvent gas for swelling the pattern mask to a center portion of the substrate mounted on the stage;

a drying gas supply part for supplying a drying gas for drying the solvent supplied to the substrate to the center portion of the substrate mounted on the stage;

an exhaust port provided for exhausting the solvent gas and the drying gas from a periphery of the substrate; and a control unit for outputting a control signal for controlling supply of the solvent gas by the solvent gas supply part, supply of the drying gas by the drying gas supply part, and exhaust from the exhaust port, wherein the control unit outputs the control signal to repeat a plurality of times steps of supplying the solvent gas to the center portion of the substrate while exhausting the solvent gas from the periphery of the substrate, and then supplying the drying gas to the center portion of the substrate while exhausting the drying gas from the periphery of the substrate.

Another substrate treatment apparatus of the present invention is a substrate treatment apparatus for performing treatment on a substrate on which a pattern mask has been formed by exposure and developing treatment to improve roughness of the pattern mask, the apparatus including:

a treatment container;

a stage provided in the treatment container;

a solvent gas supply part for supplying a solvent gas for swelling the pattern mask to a periphery of the substrate mounted on the stage;

a drying gas supply part for supplying a drying gas for drying the solvent supplied to the substrate to the periphery of the substrate mounted on the stage;

an exhaust port provided for exhausting the solvent gas and the drying gas from above a center portion of the substrate; and a control unit for outputting a control signal for controlling supply of the solvent gas by the solvent gas supply part, supply of the drying gas by the drying gas supply part, and exhaust from the exhaust port, wherein the control unit outputs the control signal to repeat a plurality of times steps of supplying the solvent gas to the periphery of the substrate while exhausting the solvent gas from above the center portion of the substrate, and then supplying the drying gas to the periphery of the substrate while exhausting the drying gas from above the center portion of the substrate.

Still another substrate treatment apparatus of the present invention is a substrate treatment apparatus for performing treatment on a substrate on which a pattern mask has been formed by exposure and developing treatment to improve roughness of the pattern mask, the apparatus including:

a treatment container;

a stage provided in the treatment container;

a solvent gas supply part for supplying a solvent gas for swelling the pattern mask to one end side of the substrate mounted on the stage;

a drying gas supply part for supplying a drying gas for drying the solvent supplied to the substrate to the one end side of the substrate mounted on the stage;

an exhaust port provided for exhausting the solvent gas and the drying gas from another end side of the substrate; and a control unit for outputting a control signal for controlling supply of the solvent gas by the solvent gas supply part, supply of the drying gas by the drying gas supply part, and exhaust from the exhaust port, wherein the control unit outputs the control signal to repeat a plurality of times steps of supplying the solvent gas to the one end side of the substrate while exhausting the solvent gas from the another end side of the substrate, and then supplying the drying gas to the one end side of the substrate while exhausting the drying gas from the another end side of the substrate.

A non-transitory computer storage medium of the present invention is a non-transitory computer-readable storage medium having a program recorded therein to execute a substrate treatment method of performing treatment on a substrate on which a pattern mask has been formed by exposure and developing treatment to improve roughness of the pattern mask, the substrate treatment method including the processes of:

mounting the substrate on a stage in a treatment container; and repeating a plurality of times steps of supplying a solvent gas to a center portion of the substrate while exhausting the solvent gas from a periphery of the substrate to swell the pattern mask, and then supplying a drying gas for drying the solvent supplied to the substrate to the center portion of the substrate while exhausting the drying gas from the periphery of the substrate.

According to the present invention, the direction in which the solvent gas flows on the substrate and the direction in which the drying gas flows on the substrate are coincide with each other so that the place where more solvent is supplied within the substrate is dried earlier by the drying gas, and the repeat of the supply of the solvent gas and the supply of the drying gas can suppress the permeation of the solvent into the pattern mask. Accordingly, it is possible to prevent dissolution of the pattern mask and smooth its surface with high uniformity, thus suppressing the decrease in yield.

DETAILED DESCRIPTION OF THE INVENTION

First Embodiment

Figure 1:
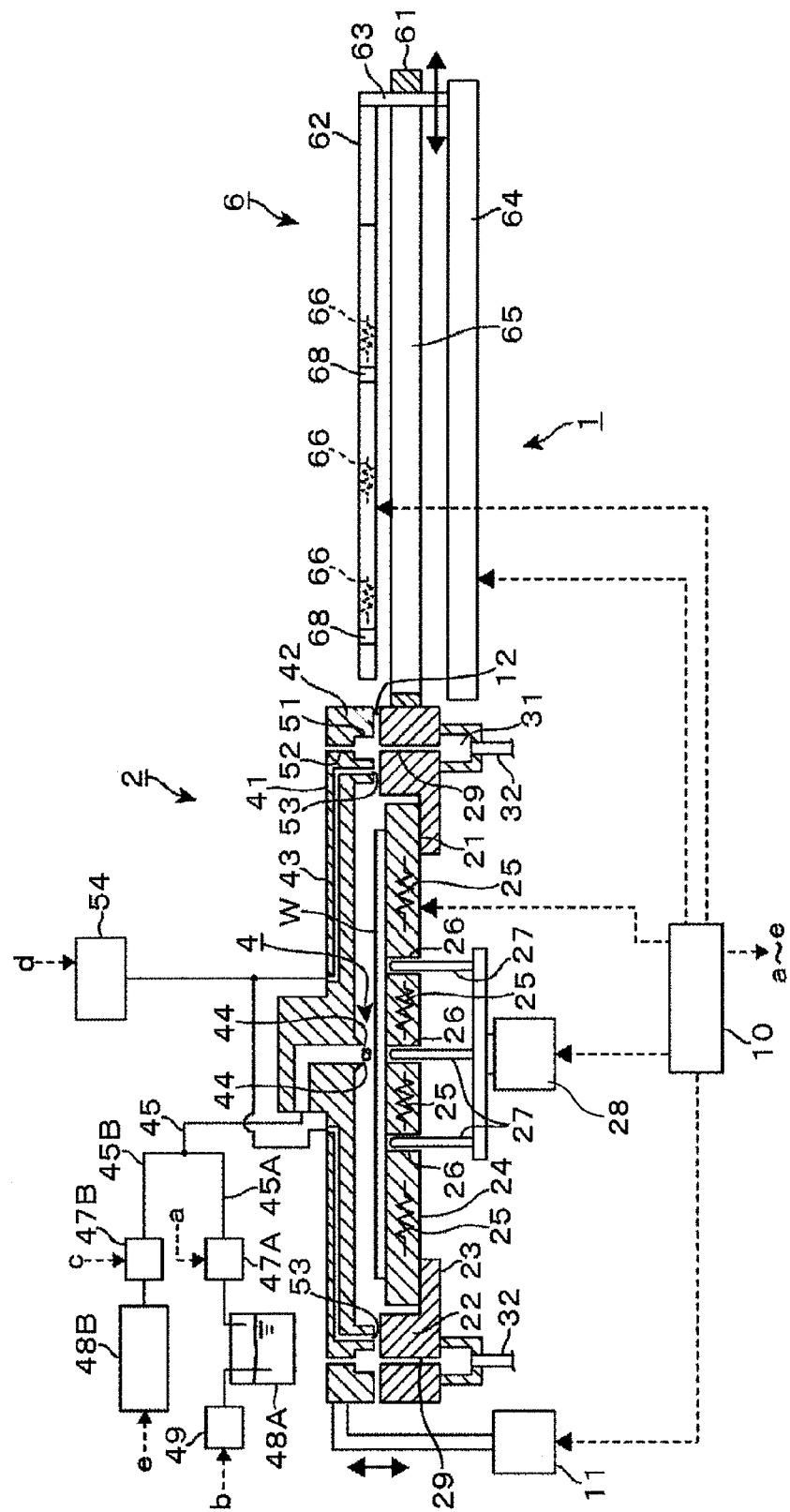
FIG. 1 is a longitudinal side view of a solvent supply apparatus according to this embodiment.

A solvent supply apparatus 1 according to an embodiment of the present invention will be described referring to FIG. 1 and FIG. 2 being a longitudinal side view and a transverse plan view thereof. The solvent supply apparatus 1 includes a treatment container 2 for treating a wafer W and a transfer mechanism 6 transferring the wafer W being a substrate between the treatment container 2 and the outside of the solvent supply apparatus 1. On the front surface of the wafer W transferred into the treatment container 2, a resist film has been formed. The resist film has undergone exposure and developing treatment and a resist pattern being a pattern mask has been formed in the resist film.

The treatment container 2 is formed in a flat circular shape and includes a container body 21 and a lid body 41. The container body 21 includes a side wall part 22 forming its peripheral edge portion and a bottom wall part 23 projecting inward from the lower end of the side wall part 22, and a stage 24 on which the wafer W is horizontally mounted is provided on the bottom wall part 23. A heater 25 forming a temperature adjusting mechanism for the stage 24 is provided in the stage 24, and the stage 24 heats the wafer W mounted thereon to a temperature set in advance. In three holes 26 provided in the stage 24, pins 27 are inserted. The pins 27 project and retract from the top of the stage 24 by means of a raising and lowering mechanism 28 to deliver the wafer W to/from the transfer mechanism 6.

In the front surface of the side wall part 22, many purge gas discharge ports 29 open along the circumferential direction thereof. A ring-shaped space 31 communicating with the purge gas discharge ports 29 is formed under the side wall part 22, and ends of a plurality of purge gas supply pipes 32 are connected to the lower part of the space 31 at intervals in the circumferential direction. The other ends of the purge gas supply pipes 32 are connected to a not-shown supply mechanism which sends an N2 gas as a purge gas under pressure, and the purge gas supplied from the supply mechanism to the space 31 spreads in the space 31 and is discharged from the purge gas discharge ports 29.

The lid body 41 is configured to freely rise and lower by means of a raising and lowering mechanism 11. The lid body 41 includes a side wall part 42 forming its peripheral edge portion and an upper wall part 43 surrounded by the side wall part 42, and the lower end of the side wall part 42 is located at a position lower than the lower end of the upper wall part 43. When treating the wafer W, the lid body 41 is moved to a treatment position illustrated in FIG. 1, whereby the lower end of the upper wall part 43 and the upper end of the side wall part 22 of the container body 21 approach to each other via a gap 12.

A center portion on the rear surface side of the upper wall part 43 projects downward to form a gas supply part 4. As illustrated in FIG. 3, many gas discharge ports 44 open along the circumferential direction at the side circumference of the gas supply part 4 and can discharge gas starting from the center portion toward the peripheral portion of the wafer W mounted on the stage 24 to thereby supply the gas over the entire wafer W. In FIG. 2, the flows of the gas discharged from the gas discharge ports 44 are indicated by broken-line arrows.

To the top of the lid body 41, the downstream end of a gas supply pipe 45 is connected, and the upstream side of the gas supply pipe 45 branches off to constitute gas supply pipes 45A, 45B. The upstream side of the gas supply pipe 45A is connected to a solvent supply source 48A via a flow rate control mechanism 47A. The solvent supply source 48A forms a tank in which a solvent capable of swelling resist is stored, and is connected to an N2 gas supply part 49 which supplies an N2 gas to a liquid phase of the stored solvent. When the N2 gas is supplied from the N2 gas supply part 49 into the solvent supply source 48A, the inside of the solvent supply source 48A is pressurized and the solvent vaporizes, and a treatment gas made of the vaporized solvent and the N2 gas is supplied from the gas discharge ports 44 to the wafer W after its flow rate is controlled by the flow rate control mechanism 47A. Further, the upstream side of the gas supply pipe 45B is connected to an N2 gas supply source 48B which sends an N2 gas being a drying gas under pressure to the downstream side via a gas flow rate control mechanism 47B. The drying gas sent under pressure is supplied from the gas discharge ports 44 to the wafer W after its flow rate is controlled by the gas flow rate control mechanism 47B.

In the lower end of the side wall part 42 of the lid body 41, a ring-shaped recessed part 51 is formed at a position overlapping with the purge gas discharge ports 29. The recessed part 51 opens to the top of the lid body 41 via a plurality of exhaust paths 52, and the plurality of exhaust paths 52 are provided in the circumferential direction of the recessed part 51. Further, at the lower end of the side wall part 42, many exhaust ports 53 are arranged in the circumferential direction of the wafer W on the inner side of the recessed part 51. The exhaust ports 53 are connected to an exhaust mechanism 54.

Figure 4:
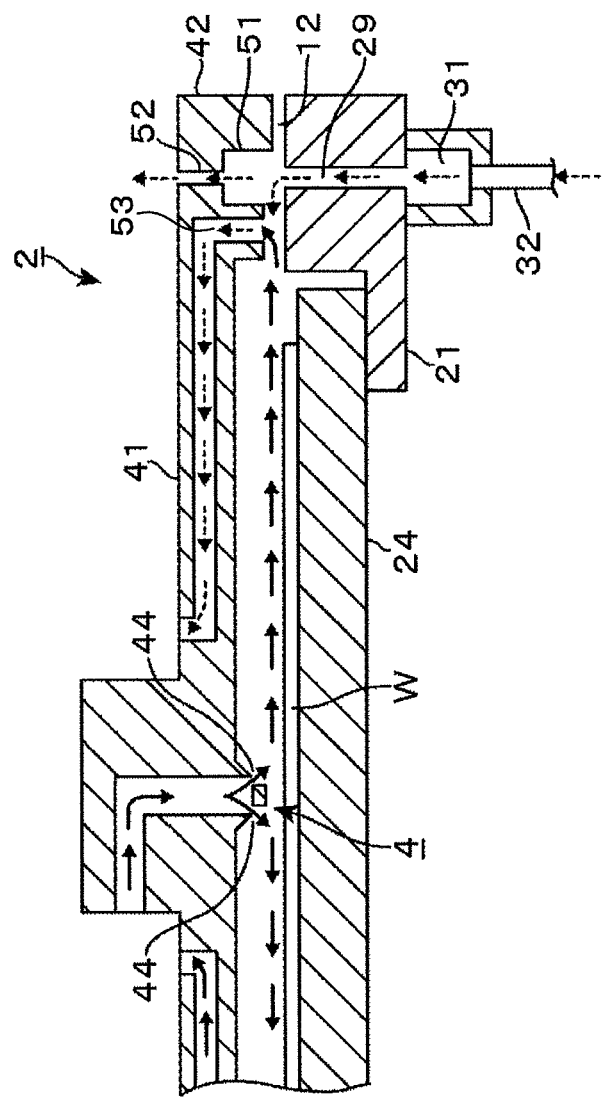
FIG. 4 is an explanatory view illustrating the flows of gases in a treatment container of the solvent supply apparatus.

In FIG. 4, the flow of the treatment gas and the flow of the purge gas inside the treatment container 2 during the treatment of the wafer W are indicated by solid arrows and dotted arrows, respectively. A part of the purge gas discharged from the purge gas discharge ports 29 flows into the recessed part 51 and flows therethrough to the outside of the treatment container 2, and another part of the purge gas flows, by suction through the exhaust ports 53, toward the inside of the treatment container 2 and into the exhaust ports 53 and is exhausted. In the state the flow of the purge gas is formed as described above, the treatment gas is discharged from the gas discharge ports 44, spreads in the lateral direction from the center portion to the peripheral portion of the wafer W, and flows toward the exhaust ports 53. Since the flow of the purge gas from the outside to the inside is formed as described above outside the exhaust ports 53, the treatment gas is blocked by the flow and never flows to the outside of the exhaust ports 53, and is removed through the exhaust ports 53. Though the flow of the treatment gas has been described, the purge gas is similarly supplied to the treatment container 2 also when the drying gas is supplied to the wafer W, and the drying gas flows through the treatment container 2 and is exhausted as with the treatment gas.

Returning to FIG. 1 and FIG. 2, the description is continued. Outside the treatment container 2, a base 61 is provided, and the aforementioned transfer mechanism 6 is provided at the base 61. The transfer mechanism 6 is composed of a horizontal moving plate 62, a support part 63 supporting the moving plate 62 on the base 61, and a moving mechanism 64. The support part 63 extends from the moving plate 62 to below the base 61 and is connected to the moving mechanism 64. Assuming that the position of the moving plate 62 illustrated in FIG. 1 and FIG. 2 is a waiting position, the moving plate 62 can horizontally move between the waiting position and a position above the stage 24 in the treatment container 2 by means of the moving mechanism 64. A numeral 65 in the drawing denotes a slit provided in the base 61 not to interfere with the movement.

The moving plate 62 will be described. Inside the moving plate 62, heaters 66 are provided, and the moving plate 62 heats the wafer W mounted on its front surface to a preset temperature. Numerals 67 in the drawing denote slits through which the pins 27 pass in order to deliver the wafer W to/from the stage 24. Numerals 68 in the drawing denote cutouts which are provided to deliver the wafer W to/from a transfer arm 13 which transfers the wafer W to the solvent supply apparatus 1.

Figure 2:
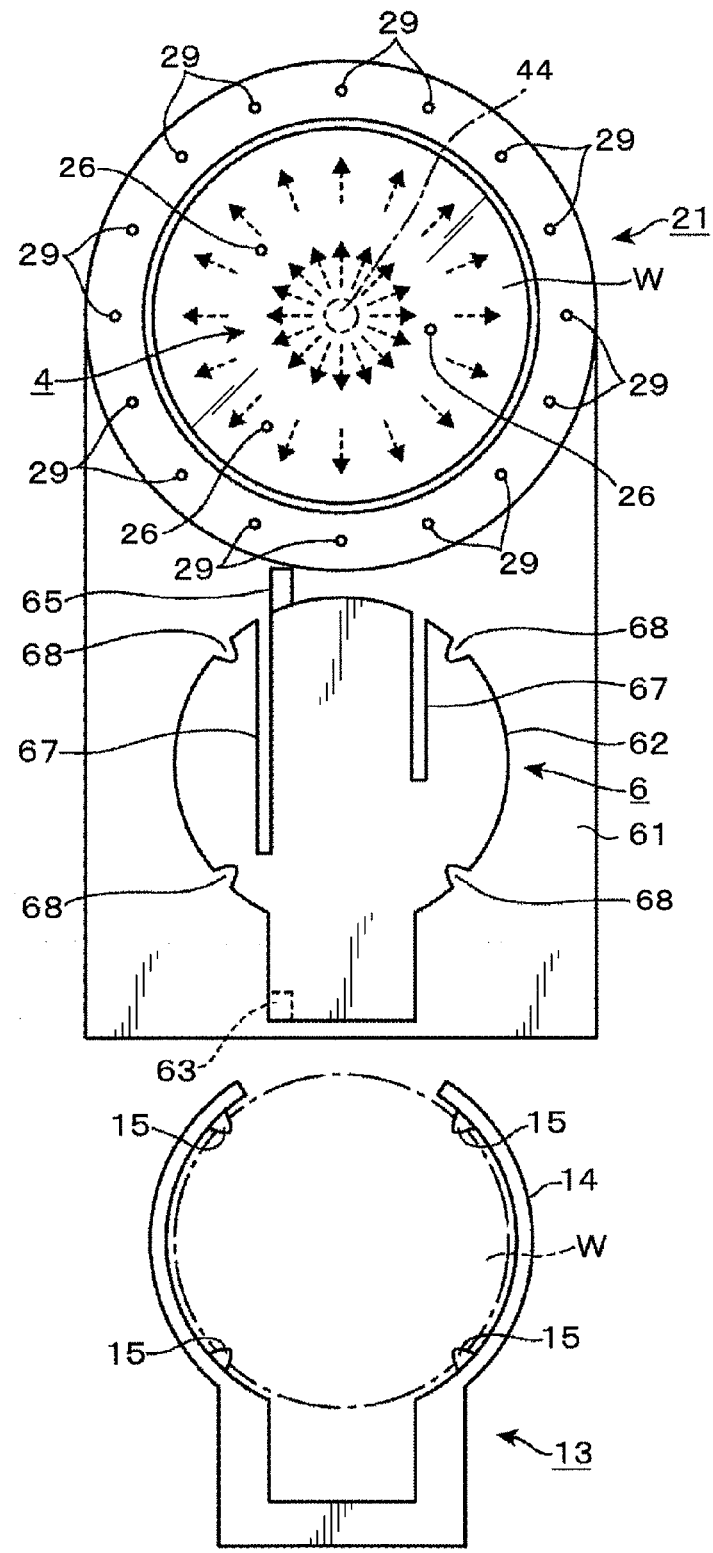
FIG. 2 is a plan view of the solvent supply apparatus.
Figure 3:
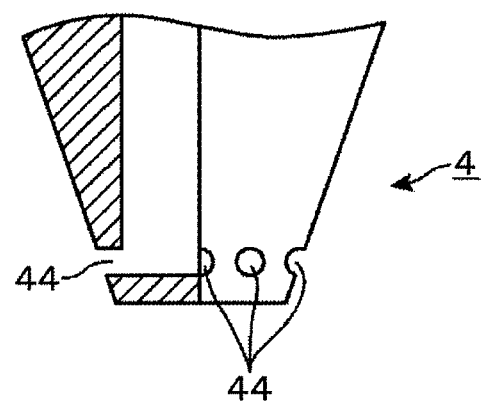
FIG. 3 is a longitudinal side view of a gas supply part of the solvent supply apparatus.

The transfer arm 13 illustrated in FIG. 2 includes a flat fork 14 surrounding the side circumference of the wafer W, and a support part 15 which extends inward from the fork 14 to support the rear surface of the wafer W. The transfer arm 13 is configured to freely move back and forth (up and down in FIG. 2) and rise and lower with respect to the moving plate 62, and delivers the wafer W to/from the moving plate 62 by combining the movements.

The solvent supply apparatus 1 includes a control unit 10 composed of a computer. The control unit 10 has commands (steps) installed to proceed the treatment in the solvent supply apparatus 1 as will be described later by sending control signals to the parts of the solvent supply apparatus 1 to control operations such as supply and stop of various gases and supply amounts of the gases, the temperatures of the wafer W on the moving plate 62 and on the stage 24, delivery of the wafer W between the treatment container 2 and the moving plate 62 and the stage 24, and exhaust the inside of the treatment container 2. This program is stored in a computer storage medium, for example, a storage medium such as a flexible disk, compact disk, hard disk, or MO (magneto-optical disk), and installed into the control unit 10.

Figure 5:
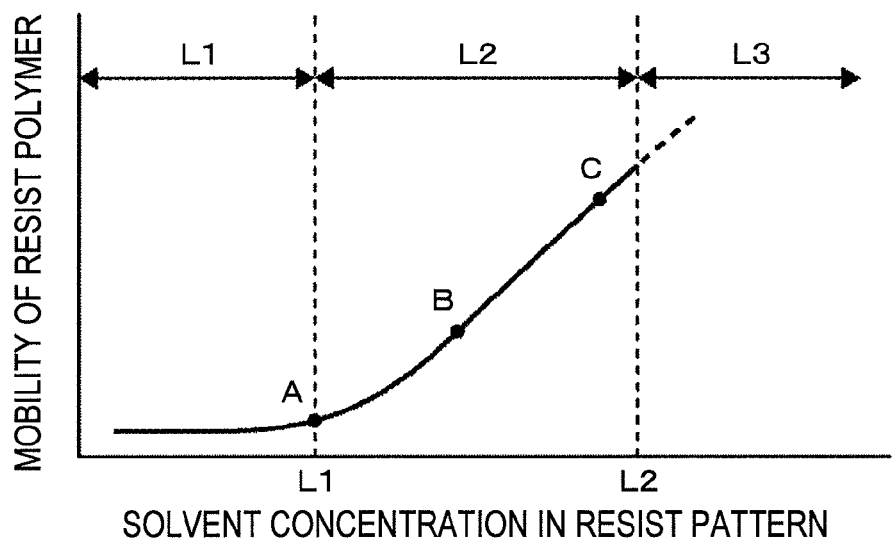
FIG. 5 is a graph chart representing the relation between the mobility of resist polymer and the solvent concentration in a resist pattern.

To describe the outline of the treatment in the above-descried solvent supply apparatus 1, the relation between the concentration of the solvent in the resist pattern on the front surface of the wafer W and the mobility of polymer constituting the resist when the already-described treatment gas is supplied to the wafer W by the solvent supply apparatus 1 will be described referring to the graph in FIG. 5. The vertical axis and the horizontal axis of the graph indicate the mobility of the resist polymer and the solvent concentration in the resist pattern, respectively.

At the time when the treatment gas is supplied to the resist pattern, molecules of the solvent move according to the temperature energy of the treatment gas. When the molecules in the solvent collide with the resist pattern, heat is conducted at the moment between the molecules and the resist pattern. Thus, the solvent gas is rapidly brought to the temperature of the wafer W, and the molecules adhere to the surface of the resist pattern. In other words, the solvent permeates the surface of the resist pattern. However, if the supply amount of the treatment gas is small and the solvent concentration in the resist pattern is in a range equal to or less than a predetermined threshold value (a range L1 in the graph), the polymer hardly flows. For example, the resist pattern in the state at a point A in the graph has a solvent concentration at the threshold value in which the polymer hardly flows as described above. When the solvent concentration in the resist pattern becomes higher than the threshold value, the flowability of the polymer increases, and the surface of the resist pattern swells to improve the roughness. For example, a state that an optimal polymer flowability can be obtained is indicated at a point B in the graph.

When the supply of the treatment gas is continued and the solvent concentration becomes too high, the solvent permeates the inside of the resist pattern, resulting in an excessive swelling amount of the resist pattern. The excessively swelling resist pattern cannot hold its shape but curves, and dissolves as described in the section of Related Art. The shape of the pattern is held at a point C in the graph, but such dissolution occurs if the solvent concentration becomes further higher. In the graph, a solvent concentration range where the pattern is improved is indicated by L2, and a solvent concentration range where the dissolution of the pattern occurs is indicated by L3.

Accordingly, in order to improve the roughness of the resist pattern with high uniformity within the wafer W, it is required to perform treatment so that the solvent concentration in the resist pattern coincides with a predetermined concentration within the rage indicated by L2 in the graph. Here, when the solvent supply apparatus 1 continuously discharges the treatment gas from the gas discharge ports 44, the amount of the supplied treatment gas near the gas discharge ports 44, that is, at the center portion of the wafer W is larger than that at the peripheral portion of the wafer W, so that the concentration of the solvent at the center portion is higher than the concentration of the solvent at the peripheral portion.

Describing more concretely, the flow speed of the treatment gas and the concentration of the treatment gas are relatively high at the center portion of the wafer W close to the gas discharge ports 44, so that the proportion (probability) of the molecules in the solvent colliding with and adhering to the resist pattern is higher as described above, resulting in progress of swelling of the resist pattern at the center portion of the wafer W. However, since the treatment gas diffuses to the peripheral portion of the wafer W, the flow speed of the treatment gas decreases and the concentration of the treatment gas decreases at the peripheral portion. Accordingly, the proportion of the molecules in the solvent colliding with and adhering to the resist pattern is low, and the resist pattern less swells than at the central portion. Further, since the solvent permeates the inside of the resist pattern due to an increase in the supply period of the treatment gas, it is required to reduce the supply period.

Hence, the drying gas (N2 gas) is supplied from the gas discharge ports 44 subsequent to the supply of the treatment gas from the gas discharge ports 44 in the solvent supply apparatus 1. Since the drying gas is discharged from the gas discharge ports 44 as with the treatment gas, the supply amount at the center portion is larger than that at the peripheral portion of the wafer W as with the treatment gas and the displacement efficiency at the center portion is higher than that at the peripheral portion. Describing in more detail, the amount of the molecules in the solvent collided with and adhered to the resist pattern as described above but separating from the resist pattern, that is, the amount vaporizing from the resist pattern as the solvent gas is affected by the balance between the solvent concentration in a gas layer directly above the wafer W and the solvent concentration in the resist pattern. This balance is the vapor-liquid equilibrium between the liquid solvent in the resist pattern and the gas solvent in the gas layer. The drying gas supplied from the gas discharge ports 44 is higher in flow speed on the center portion side of the wafer W closer to the gas discharge ports 44 as with the solvent gas, so that the solvent concentration in the gas layer directly above the center portion of the wafer W is lower than the solvent concentration directly above the peripheral portion of the wafer W and the vaporization is accelerated more at the center portion than at the peripheral portion. In other words, since the speed of the solvent dried and removed is higher at the center portion of the wafer W than at the peripheral portion, the solvent concentration in the resist pattern is made uniform between the center portion and the peripheral portion.

Then, the supply of the treatment gas, and drying treatment composed of the supply of the drying gas and the heating by the moving plate 62 are repeatedly performed to prevent the solvent from permeating the inside of the resist pattern and ensure a sufficient time period when the solvent concentration on the surface of the resist pattern falls within the range L2 in the graph to thereby improve the roughness of the pattern. The N2 gas is used as the drying gas in this embodiment, but the drying gas is not limited to that and, for example, dry air may be used. Further, since the solvent concentration in the atmosphere directly above the wafer W is decreased also by increasing the temperature of the wafer W, vaporization of the solvent from the resist pattern proceeds due to the aforementioned vapor-liquid equilibrium. Hence, in this embodiment, drying of the resist pattern is performed also by heating using the moving plate 62 in addition to the supply of the drying gas as described above.

Figure 11:
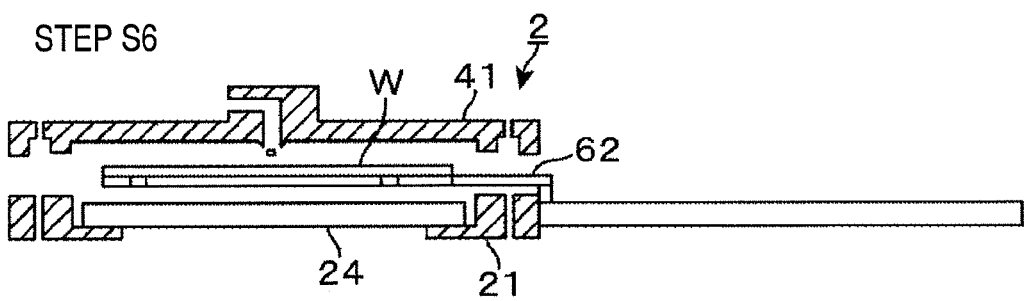
FIG. 11 is a process chart illustrating treatment by the solvent supply apparatus.
Figure 12:
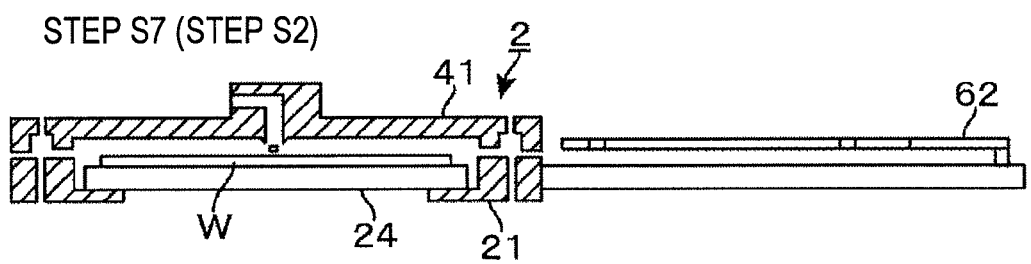
FIG. 12 is a process chart illustrating treatment by the solvent supply apparatus.
Figure 13:
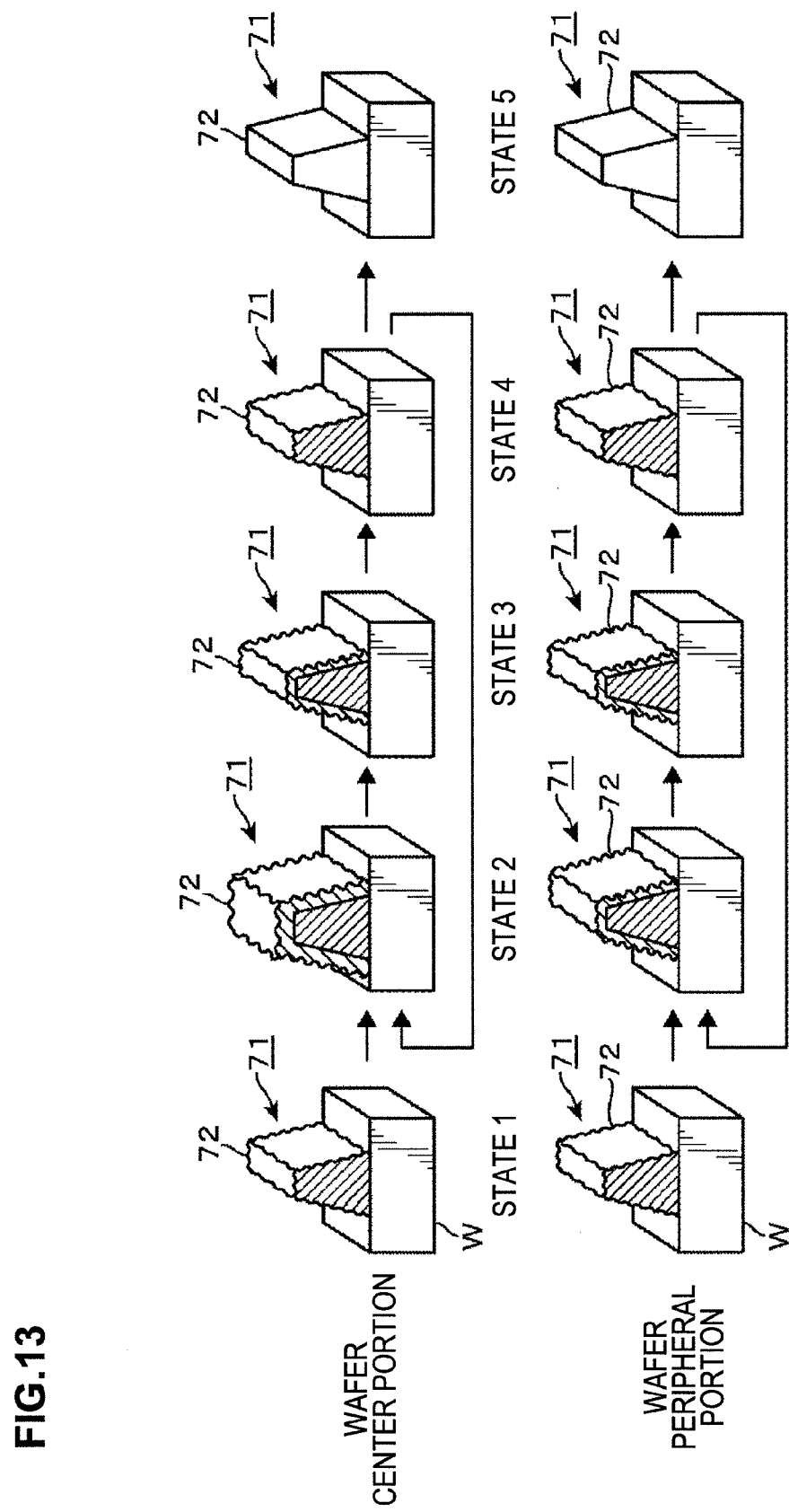
FIG. 13 is a schematic view illustrating states of the resist pattern.
Figure 14:
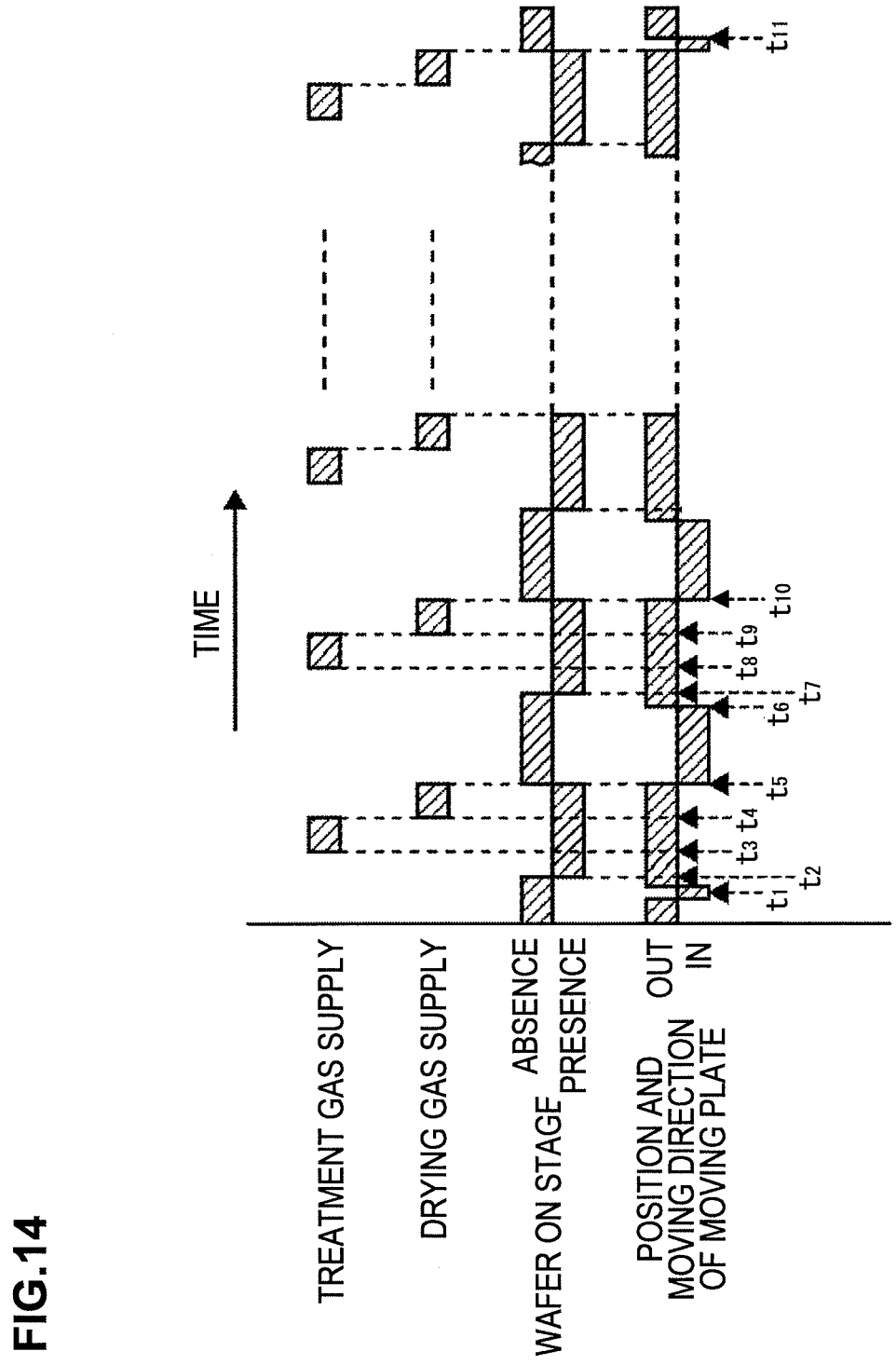
FIG. 14 is a time chart indicating the gas supply and action by the solvent supply apparatus.

Hereinafter, the operation of the solvent supply apparatus 1 will be concretely described referring to FIG. 6 to FIG. 12 illustrating the actions of the solvent supply apparatus 1 in respective processes and FIG. 13 being a schematic view of the resist pattern at the respective stages of the treatment. The upper tier in FIG. 13 is a schematic view of the resist pattern at the center portion of the wafer W at the respective stages in the treatment, and the lower tier is a schematic view of the resist pattern at the peripheral portion of the wafer W at the respective stages in the treatment. The description is made also referring to FIG. 14 as necessary. FIG. 14 is a time chart indicating a zone when the treatment gas is supplied, a zone when the N2 gas is supplied, the presence/absence of the wafer W on the stage 24, and the position and the moving direction of the moving plate 62 which are associated with one another. In this time chart, about the position and the moving direction of the moving plate 62, the time when the moving plate 62 is located above the stage 24 and the time when the moving plate 62 is moving toward the stage 24 are indicated by "IN", and the time when the moving plate 62 is located at the waiting position and the time when the moving plate 62 is moving from the position above the stage 24 to the waiting position are indicated by "OUT."

Figure 6:
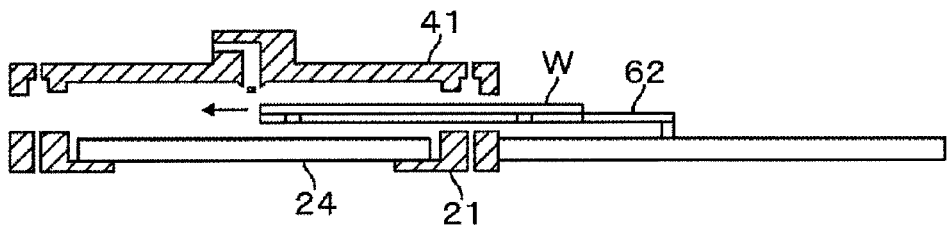
FIG. 6 is a process chart illustrating treatment by the solvent supply apparatus.
Figure 7:
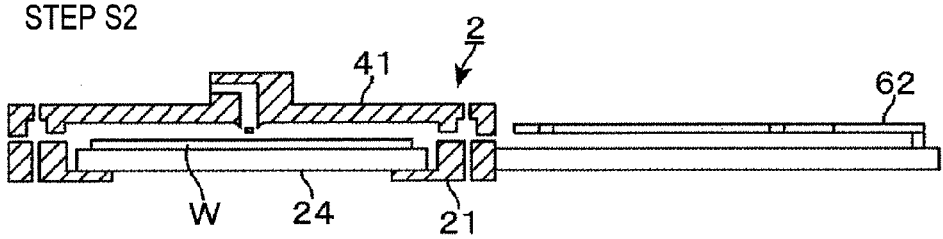
FIG. 7 is a process chart illustrating treatment by the solvent supply apparatus.

First, the wafer W is delivered by the transfer arm 13 to the moving plate 62 located at the waiting position. As indicated as state 1 in FIG. 13, a surface 72 of a resist pattern 71 of the wafer W is rough and formed with projections and depressions. The moving plate 62 moves to a position above the stage 24 as illustrated in FIG. 6 (time t1 in FIG. 14) (Step S1). Then, when the pins 27 are raised to receive the wafer W, the moving plate 62 returns to the waiting position, and the pins 27 are lowered and the wafer W is mounted on the stage 24 controlled to the predetermined temperature as illustrated in FIG. 7 (time t2 in FIG. 14). The mounted wafer W is adjusted in temperature to 18° C. to 50° C. so that the molecules in the solvent constituting the treatment gas adhere to the surface of the resist pattern during supply of the treatment gas (Step S2).

Figure 8:
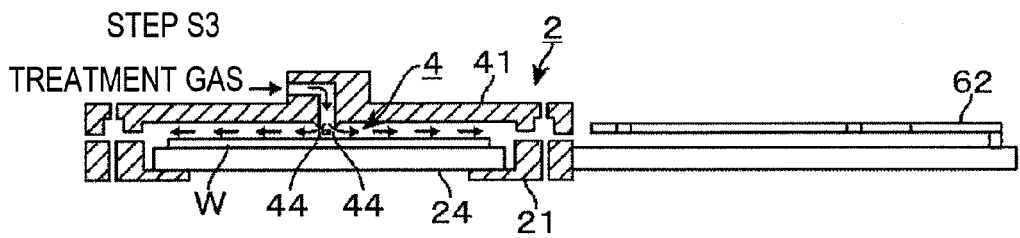
FIG. 8 is a process chart illustrating treatment by the solvent supply apparatus.

In parallel with the temperature adjustment of the wafer W, lowering of the lid body 41, discharge of the purge gas from the purge gas discharge ports 29, and exhaust of the purge gas from the exhaust ports 53 are performed. After a lapse of, for example, 10 seconds after the wafer W is mounted on the stage 24, the treatment gas is supplied from the gas discharge ports 44 of the gas supply part 4 to the center portion of the wafer W as illustrated in FIG. 8 (time t3 in FIG. 14), flows to the peripheral portion of the wafer W and is exhausted together with the purge gas (Step S3). Note that though only the flow of the gas around the wafer W is illustrated for preventing the drawing from being complicated in the operation view such as FIG. 8, the gas flows are actually formed in the treatment container 2 as illustrated in FIG. 4.

The molecules of the solvent constituting the treatment gas adhere to and permeate the surface 72 of the resist pattern 71, the surface 72 swells as illustrated at state 2 in FIG. 13, and the resist polymer flows. In this event, the supply amount of the treatment gas is larger at the center portion of the wafer W than that at the peripheral portion as has been described, so that the swelling amount of the surface 72 at the center portion is larger than the swelling amount of the surface 72 at the peripheral portion.

Figure 9:
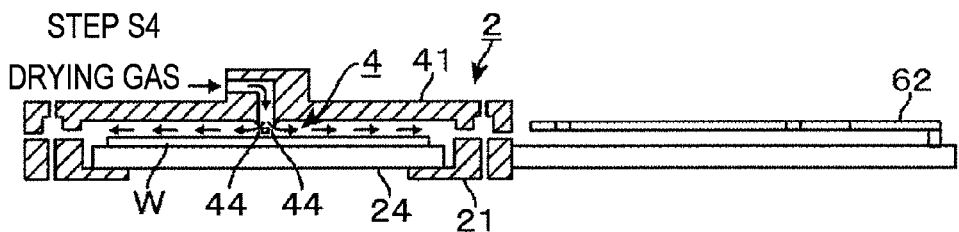
FIG. 9 is a process chart illustrating treatment by the solvent supply apparatus.

After a lapse of a predetermined time, for example, 5 to 10 seconds after the supply of the treatment gas is started, the supply of the treatment gas is stopped, and the drying gas is discharged from the gas discharge ports 44 to the center portion of the wafer W, flows to the peripheral portion, and is exhausted together with the purge gas as illustrated in FIG. 9 (time t4 in FIG. 14) (Step S4). By exposure to the drying gas, the solvent permeated the surface of the resist pattern 71 vaporizes and dries. In this event, the drying speed of the solvent is higher at the center portion of the wafer W than that at the peripheral portion as has been described, so that the swelling amount of the surface 72 at the center portion and the swelling amount of the surface 72 at the peripheral portion are made uniform as illustrated at state 3 in FIG. 13.

Figure 10:
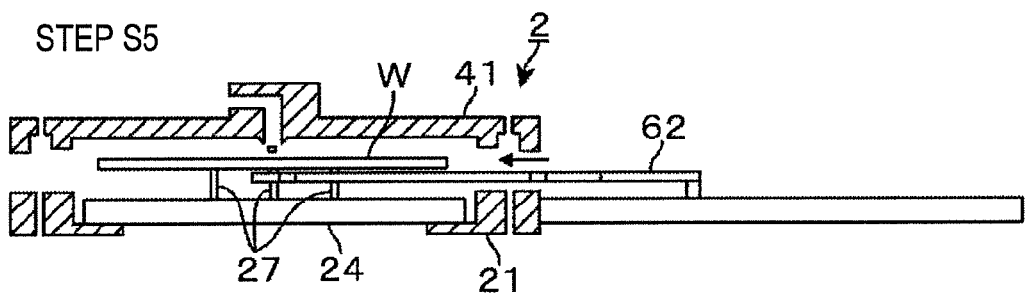
FIG. 10 is a process chart illustrating treatment by the solvent supply apparatus.

After a lapse of, for example, 5 to 10 seconds after the supply of the drying gas is started, the supply of the drying gas from the gas discharge ports 44 and the supply of the purge gas from the purge gas discharge ports 29 are stopped, and the lid body 41 is raised to open the treatment container 2. As illustrated in FIG. 10, the pins 27 raise the wafer W, and the moving plate 62 moves to a position above the stage 24 (time t5 in FIG. 14) (Step S5). When the moving plate 62 is controlled to a temperature higher than that of the stage 24 by the heaters 66 and the pins 27 are lowered to mount the wafer W on the moving plate 62 as illustrated in FIG. 11, the whole wafer W is heated to, for example, 60° C. Thus, the surface 72 of the resist pattern 71 at the center portion and the peripheral portion of the wafer W is further dried and the temperature of the wafer W is further increased, whereby the flowability of the polymer constituting the resist pattern increases to proceed the improvement of the projections and depressions as illustrated at state 4 in FIG. 13. When the drying of the surface 72 proceeds, the flowability of the polymer decreases to suppress the permeation of the solvent into the resist pattern 71 (Step S6).

After a lapse of, for example, 10 to 60 seconds after the wafer W is mounted on the moving plate 62, the pins 27 are raised to lift up the wafer W from the moving plate 62, and the moving plate 62 moves to the waiting position (time t6 in FIG. 14). The pins 27 are lowered to mount the wafer W on the stage 24 (time t7 in FIG. 14), and the lid body 41 of the treatment container 2 is lowered, and the wafer W is adjusted in temperature by the stage 24 as illustrated in FIG. 12 (Step S7). In other words, the above-described Step S2 is performed again.

Thereafter, the supply of the treatment gas at Step S3 (time t8 in FIG. 14), the supply of the drying gas at Step S4 (time t9 in FIG. 14), the delivery of the wafer W to the moving plate 62 at Step S5 (time t10 in FIG. 14), the heating of the wafer W at Step S6 are performed, and after completion of Step S6, the treatments at Steps S2 to S6 are further repeatedly performed as illustrated in the time chart in FIG. 14. Thereby, the resist pattern 71 at the center portion and the peripheral portion of the wafer W is repeatedly brought into the states of state 2 to state 4 in FIG. 13 and the projections and depressions on the resist pattern are gradually evened out, whereby the surface 72 is smoothed as in state 5. After a predetermined number of times of Steps S2 to S6 set in advance are performed, the moving plate 62 returns to the waiting position with the wafer W mounted thereon (time t11 in FIG. 14), and the transfer arm 13 receives the wafer W and transfers the wafer W to the outside of the solvent supply apparatus 1. Thereafter, in order to completely remove the solvent, the wafer W is transferred, for example, to a heating apparatus and heated at a temperature higher than the heating temperature by the moving plate 62.

According to this solvent supply apparatus 1, the treatment gas composed of the solvent is supplied by the gas supply part 4 starting from the center portion of the wafer W to the peripheral portion and the drying gas is subsequently supplied by the gas supply part 4 starting from the center portion of the wafer W to the peripheral portion, and the supply of the treatment gas and the drying gas is repeatedly performed on one wafer W. This makes it possible to control the swelling amount within the wafer W by the treatment gas with high uniformity and prevent the solvent from excessively permeating the resist pattern. Therefore, it is possible to prevent the resist pattern from being dissolved and improve the roughness of the surface of the resist pattern with high uniformity within the wafer W.

Further, in the solvent supply apparatus 1, heating performed on the wafer W by the moving plate 62 after the supply of the drying gas increases the drying speed of the solvent, resulting in improved throughput. The temperature of the stage 24 may be set to be high instead of heating by the moving plate 62, but it is more effective that the moving plate 62 temperature-adjusted to be higher than the stage 24 moves the wafer W for drying in order to prevent the volatile amount of the solvent from the wafer W from becoming too much during the supply of the treatment gas. However, the resist pattern may be dried by continuing the supply of the drying gas without moving the wafer W by the moving plate 62, or the wafer W may be heated with the wafer W mounted on the stage 24 after the supply of the drying gas. The temperature of the wafer W heated in this event is a temperature equal to or higher than the temperature when the treatment gas and the drying gas are supplied.

Second Embodiment

Figure 15:
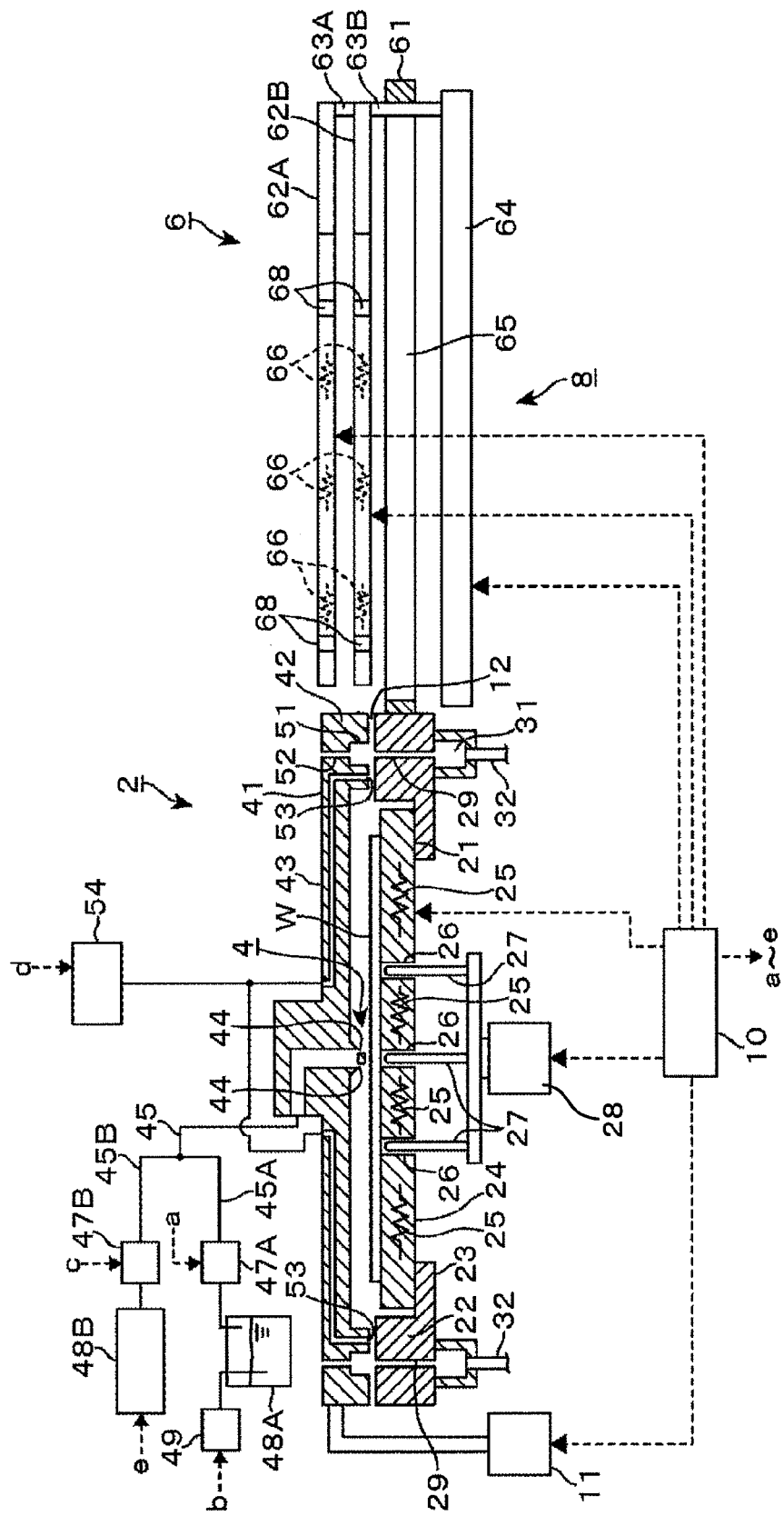
FIG. 15 is a longitudinal side view of a solvent supply apparatus according to another embodiment.
Figure 16:
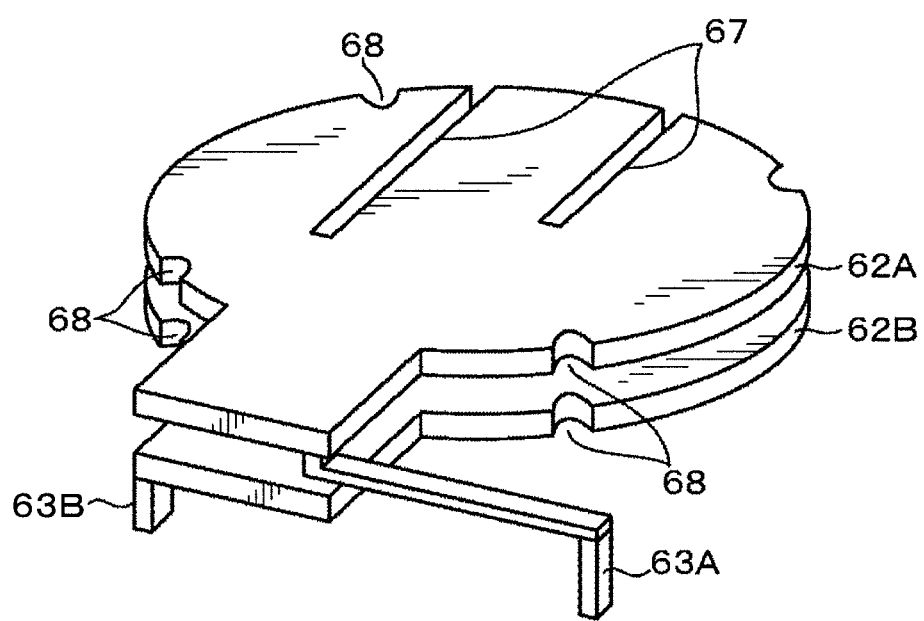
FIG. 16 is a perspective view of a moving plate of the solvent supply apparatus.

FIG. 15 illustrates a solvent supply apparatus 8 being a second embodiment. In the solvent supply apparatus 8, the same numerals and symbols are given to the portions similarly configured as those in the solvent supply apparatus 1 and the description thereof will be omitted. The point in the solvent supply apparatus 8 different from the solvent supply apparatus 1 is that the transfer mechanism 6 is composed of two moving plates. FIG. 16 illustrates a perspective view of moving plates 62A, 62B. The moving plates 62A, 62B are configured similarly to the moving plate 62 and movable independently from each other by means of a moving mechanism 64. Numerals 63A, 63B in the drawing are support parts which correspond to the support part 63 in the first embodiment. The support part 63A supporting the upper moving plate 62A is bent outward from the lower side and further bent downward in order not to interfere with the independent movements of the moving plates 62A, 62B. Further, positions of the moving plates 62A, 62B illustrated in FIG. 15 are waiting positions for the moving plates 62A, 62B in the following description.

The solvent supply apparatus 8 is controlled to simultaneously treat two wafers W1, W2 such that while the wafer W1 is supplied with the treatment gas and the drying gas inside the treatment container 2, the wafer W2 is subjected to drying treatment by the moving plate 62B outside the treatment container 2. Conversely, while the wafer W2 is supplied with the treatment gas and the drying gas inside the treatment container 2, the wafer W1 is subjected to drying treatment by the moving plate 62A outside the treatment container 2. The wafer W1 is a wafer W that is first transferred into the solvent supply apparatus 8, and the wafer W2 is a wafer W that is transferred into the solvent supply apparatus 8 subsequent to the wafer W1.

Figure 25:
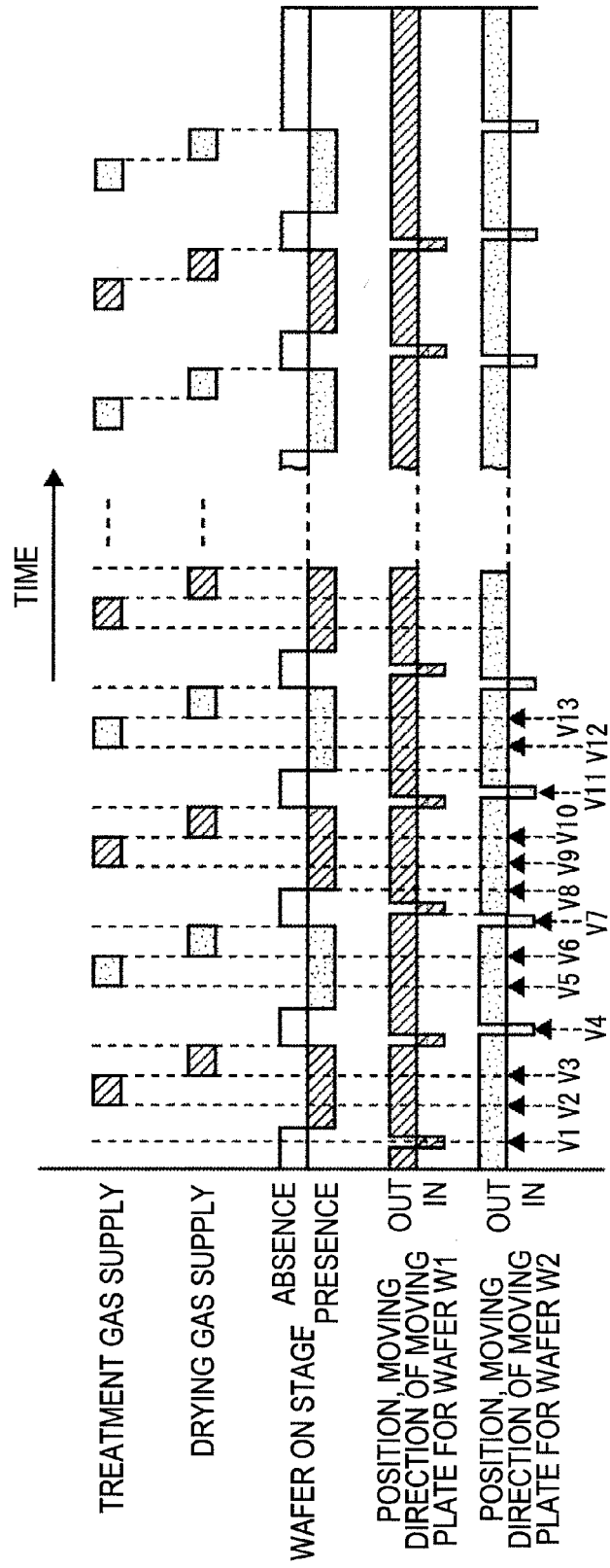
FIG. 25 is a time chart indicating the gas supply and action by the solvent supply apparatus.

Hereinafter, the operation of the second embodiment will be described referring to FIG. 17 to FIG. 24 illustrating the actions of the solvent supply apparatus 8 and a time chart in FIG. 25 mainly for the different points from the operation of the first embodiment. The time chart in FIG. 25 indicates zones when the respective gases are supplied, the presence/absence of the wafer W on the stage 24, and the actions of the moving plates 62A, 62B which are associated with one another as in the time chart described in the first embodiment. In FIG. 25, the zones when the respective gases are supplied to the wafer W1 and the zone when the wafer W1 is mounted on the stage 24 are indicated with diagonal lines. Further, in FIG. 25, the zones when the respective gases are supplied to the wafer W2 and the zone when the wafer W2 is mounted on the stage 24 are indicated with many dots. Further, since the moving plates 62A, 62B transfer the wafers W1, W2 respectively in this embodiment, the action of the moving plate 62A is indicated with diagonal lines and the action of the moving plate 62B is indicated with many dots in the time chart.

Figure 17:
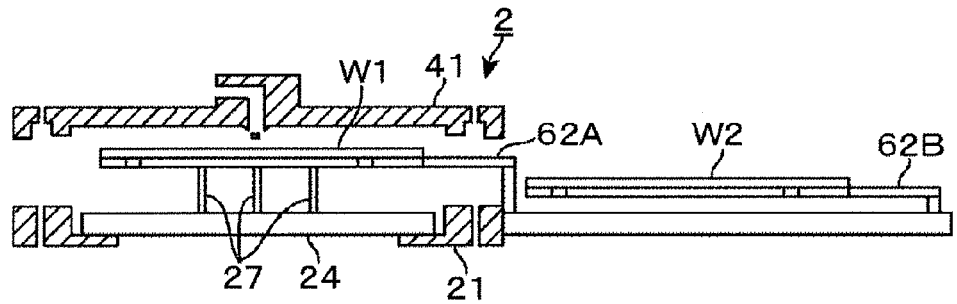
FIG. 17 is a process chart illustrating treatment by the solvent supply apparatus.
Figure 18:
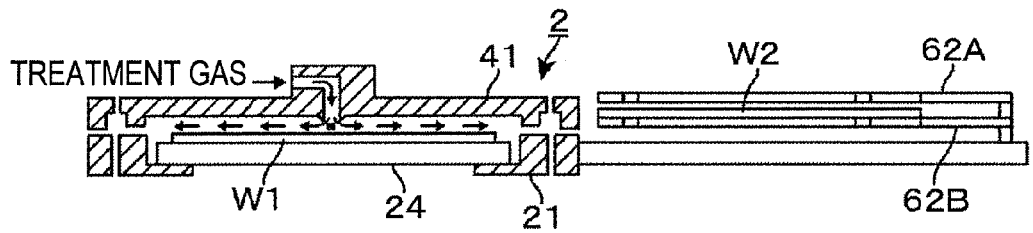
FIG. 18 is a process chart illustrating treatment by the solvent supply apparatus.
Figure 19:
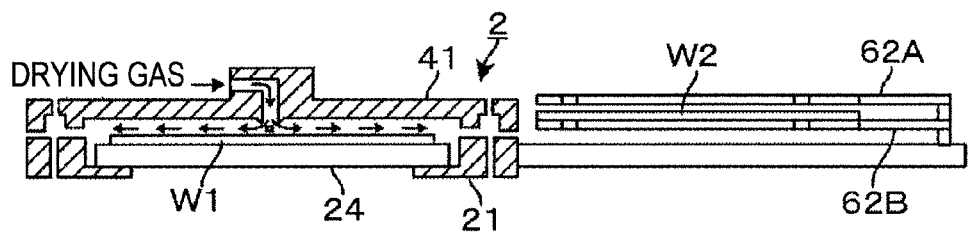
FIG. 19 is a process chart illustrating treatment by the solvent supply apparatus.

First, the wafer W1 is delivered to the moving plate 62A located at the waiting position, and the moving plate 62A moves to a position above the stage 24 and the wafer W2 is delivered to the moving plate 62B located at the waiting position as illustrated in FIG. 17 (time v1 in FIG. 25). After the wafer W1 is adjusted in temperature on the stage 24 as in the first embodiment, the treatment gas is supplied to the wafer W1 as illustrated in FIG. 18 (time v2 in FIG. 25), and the drying gas is subsequently supplied as illustrated in FIG. 19 (time v3 in FIG. 25).

Figure 20:
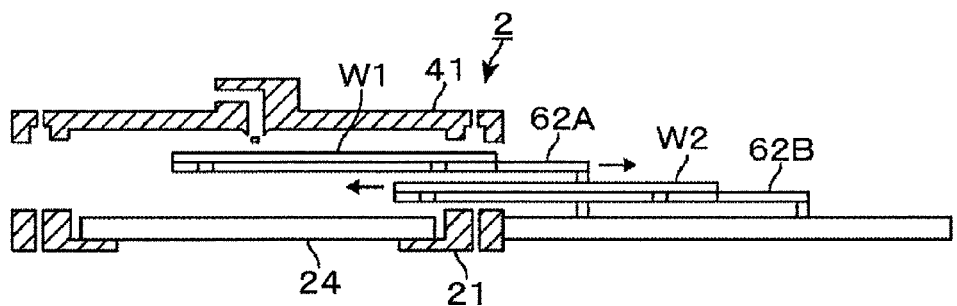
FIG. 20 is a process chart illustrating treatment by the solvent supply apparatus.
Figure 21:
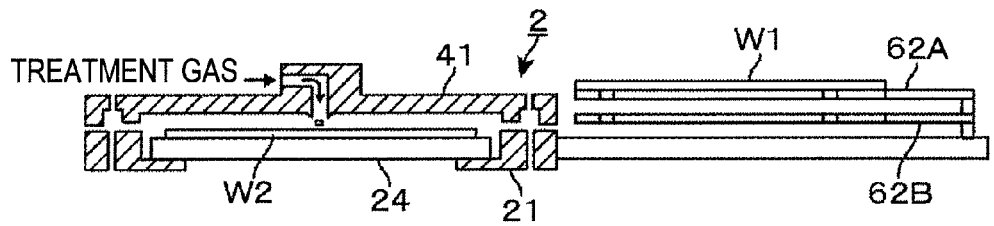
FIG. 21 is a process chart illustrating treatment by the solvent supply apparatus.
Figure 22:
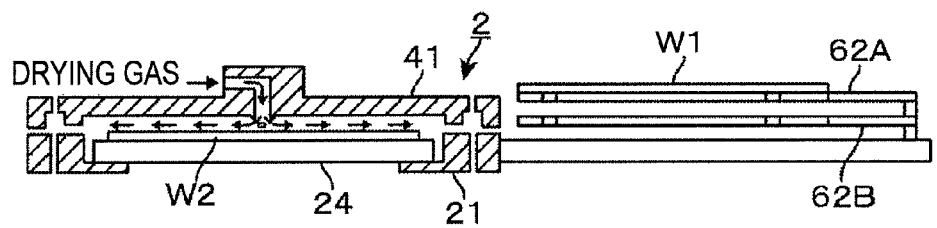
FIG. 22 is a process chart illustrating treatment by the solvent supply apparatus.

After completion of the supply of the drying gas, the wafer W1 is delivered to the moving plate 62A moved to the position above the stage 24 and the wafer W1 is heated. As illustrated in FIG. 20, the moving plate 62A moves to the waiting position and the moving plate 62B moves to a position above the stage 24 (time v4 in FIG. 25). After the wafer W2 is adjusted in temperature on the stage 24, the treatment gas is supplied to the wafer W2 as illustrated in FIG. 21 (time v5 in FIG. 25), and the drying gas is subsequently supplied as illustrated in FIG. 22 (time v6 in FIG. 25). In parallel with the temperature adjustment of the wafer W2 and the supply of the treatment gas and the supply of the drying gas, the drying treatment for the wafer W1 is continued on the moving plate 62A.

Figure 23:
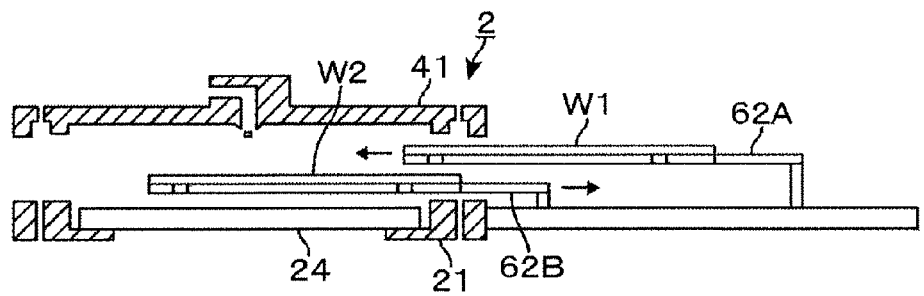
FIG. 23 is a process chart illustrating treatment by the solvent supply apparatus.
Figure 24:
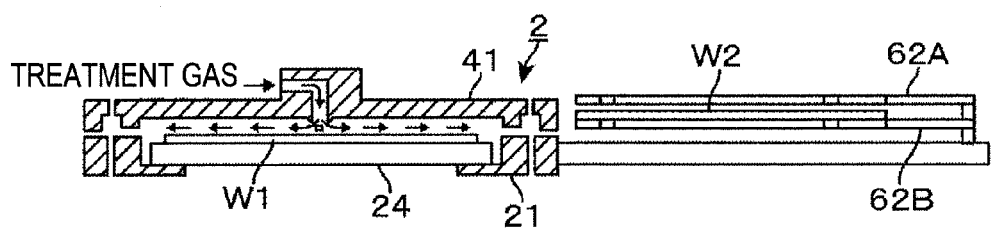
FIG. 24 is a process chart illustrating treatment by the solvent supply apparatus.

After completion of the supply of the drying gas to the wafer W2, the wafer W2 is delivered to the moving plate 62B moved to the position above the stage 24 and the wafer W2 is heated. As illustrated in FIG. 23, the moving plate 62B moves to the waiting position and the moving plate 62A moves to the position above the stage 24 (time v7 in FIG. 25). After the wafer W1 is delivered onto the state 24 (time v8 in FIG. 25), and the moving plate 62A returns to the waiting position. During the time when the wafer W1 is adjusted in temperature again and the supply of the treatment gas (time v9 in FIG. 25) and subsequently the supply of the drying gas (time v10 in FIG. 25) are sequentially performed, the heating of the wafer W2 is continued by the moving plate 62B. Thereafter, the wafer W2 is delivered onto the state 24 (time v11 in FIG. 25), and during the time when the wafer W2 is adjusted in temperature again, the supply of the treatment gas (time v12 in FIG. 25), and the supply of the drying gas (time v13 in FIG. 25) are sequentially performed, the heating of the wafer W1 is continued by the moving plate 62A.

Thereafter, delivery of the wafers W1, W2 between the stage 24 and the moving plates 62A, 62B is repeated, and each of the wafers W1, W2 is supplied with the treatment gas and the drying gas, for example, 20 times as in the first embodiment, and then transferred out of the solvent supply apparatus 8. According to the second embodiment, the same effects as those of the first embodiment can be achieved as well as the throughput can be improved because while one of the wafers W1, W2 is treated in the treatment container 2, the other is subjected to drying treatment on the moving plate 62. Note that the number of moving plates 62 may be three or more.

In each of the embodiments, it is only necessary to repeat twice or more the supply of the treatment gas and the drying gas to one wafer W. However, it is difficult to even out the projections and depressions of the resist pattern unless the solvent concentration in the resist pattern is higher than a predetermined concentration as has been described with FIG. 5. Hence, assuming that the supply cycle of the treatment gas and the drying gas is performed X times (X≥2) in each of the embodiments, the treatment may be performed such that the supply amount of the treatment gas is relatively large in n times (1≤n≤X) of cycles in a first half and the supply amount of the treatment gas is made smaller in X-n times of cycles in a second half than that in the cycles in the first half. In the cycles in the first half, the solvent concentration in the resist pattern greatly increases every time each cycle is performed and rapidly reaches the range of L2 where the resist pattern shape illustrated in FIG. 5 is improved, so that the throughput can be improved. Then, in the cycles in the second half, the increase in the solvent concentration is suppressed and excessive supply of the solvent gas to the resist pattern can be prevented, thus making it possible to more surely prevent the resist pattern from being dissolved.

As described above, the wafer W is adjusted in temperature, for example, to 18° C. to 50° C. before the supply of the treatment gas. In the case of adjusting the temperature of the wafer W to a temperature lower than that in a clean room in which the solvent supply apparatus 1 is installed, a flow path for a coolant is provided in the stage 24 in place of the heater 25 to cool the surface of the stage 24. Note that in the case of providing the flow path, the drying treatment may be performed by controlling the output of the heater 25 without using the moving plate 62. For example, when the supply of the drying gas is performed after the supply of the treatment gas, drying is performed by increasing the output of the heater 25 to be higher than that at the supply of the treatment gas without passing the coolant through the flow path. Then, after the supply of the drying gas, the output of the heater 25 is decreased, and the coolant is passed through the flow path to decrease the temperature of the stage 24, and then the treatment gas is supplied. With this configuration, the delivery time between the stage 24 and the moving plate 62 may be omitted.

Figure 26:
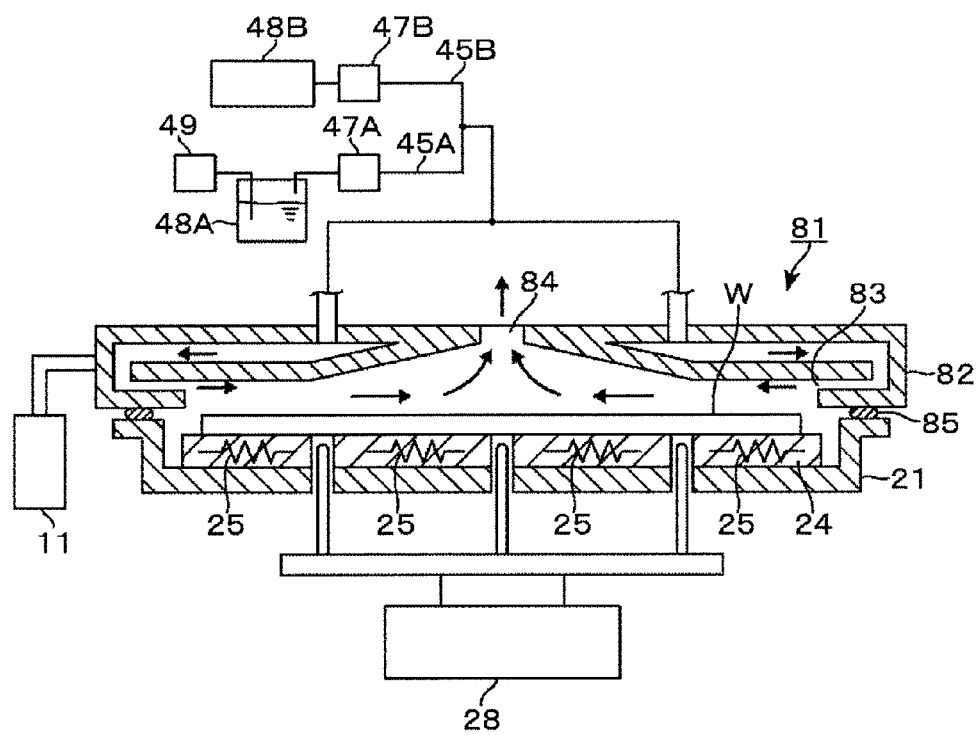
FIG. 26 is a longitudinal side view illustrating another configuration of the treatment container constituting the solvent supply apparatus.

Repeating the swelling and drying of the resist pattern is not limited to the supply of the gases to the center portion of the wafer W while exhausting the gases from the periphery of the wafer W as in the first and second embodiments. Hereinafter, another example of supply and exhaust of gases will be described. FIG. 26 is a longitudinal side view of a treatment container 81. A lid body 82 constituting the treatment container 81 is provided with a ring-shaped gas discharge port 83 outside the wafer W in a manner to surround the wafer W. Further, an exhaust port 84 is opened above the center portion of the wafer W so that the treatment gas and the drying gas discharged from the gas discharge port 83 flow to the center portion of the wafer W and are exhausted from the exhaust port 84 as indicated with arrows in the drawing. A numeral 85 in the drawing denotes a sealing material.

Since the treatment gas discharged from the gas discharge port 83 gathers to the center portion of the wafer W, the flow speed of the treatment gas becomes higher at the center portion of the wafer W than at the peripheral portion, whereby the concentration of the treatment gas becomes higher and the proportion of the molecules of the treatment gas colliding with the resist pattern therefore increases. As a result of that, the swelling amount of the resist pattern becomes larger at the center portion of the wafer W than that at the peripheral portion. However, the drying gas is thereafter supplied in the same direction as that of the treatment gas. As in the case of supplying the treatment gas, the flow speed and the concentration of the drying gas become higher and therefore the drying power by the drying gas is higher at the center portion of the wafer W. In other words, since the drying speed is higher at the center portion than that at the peripheral portion of the wafer W, so that the swelling amount of the resist pattern can be made uniform within the wafer W.

Figure 27:
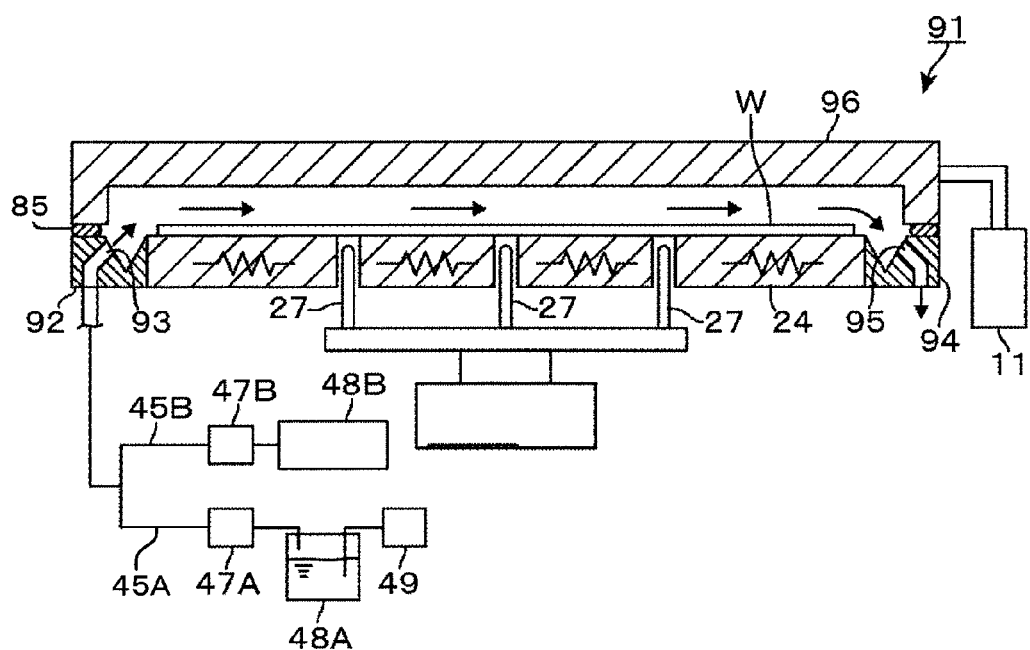
FIG. 27 is a longitudinal side view illustrating still another configuration of the treatment container constituting the solvent supply apparatus.
Figure 28:
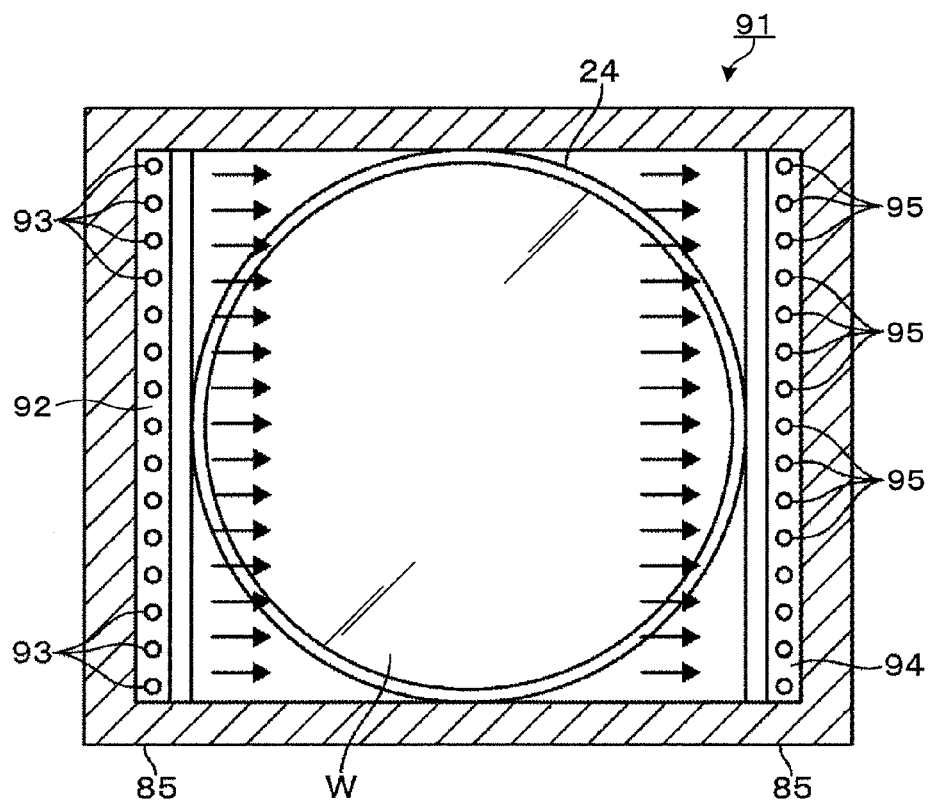
FIG. 28 is a transverse plan view of the treatment container.

FIG. 27, FIG. 28 illustrate a longitudinal side view and a transverse plan view of a treatment container 91, respectively. A numeral 92 in the drawings denotes a gas supply part provided on one end side of the stage 24, and gas discharge ports 93 are formed in its upper surface. A numeral 94 in the drawings denotes an exhaust part provided on the other end side of the stage 24 and includes exhaust ports 95. The treatment gas and the drying gas discharged from the gas discharge ports 93 flow from one end side to the other end side of the wafer W between the stage 24 and a ceiling plate of a lid body 96 of the treatment container 91 and is exhausted.

In the treatment container 91 in which the treatment gas flows in one direction as described above, the distribution of the flow speed on the front surface of the wafer W is suppressed as compared to the treatment container in which the treatment gas flows from the peripheral portion side to the center portion side or from the center portion side to the peripheral portion side, and therefore the gradient in solvent concentration of the resist pattern is less likely to be formed within the wafer W. However, in the treatment container 91, the treatment gas discharged from the gas discharge ports 93 flows to the exhaust ports 95 while the solvent molecules contained therein are being absorbed into the wafer W. Therefore, the solvent concentration gradually decreases as it is closer to the downstream side of the treatment gas on the front surface of the wafer W. In other words, the proportion (probability) of the solvent molecules colliding on one end portion of the wafer W closer to the gas discharge ports 93 becomes higher than the proportion (probability) of the solvent molecules colliding on the other end portion of the wafer W closer to the gas exhaust ports 95, and the swelling amount becomes larger on one end portion than on the other end portion. However, when supplying the drying gas from the gas discharge ports 93 thereafter, the drying gas flows to the exhaust ports 95 while taking the solvent atmosphere thereinto, whereby the concentration becomes higher at the one end portion than that at the other end portion and therefore the drying power becomes higher at the one end portion of the wafer W than that at the other end portion. As a result, the solvent concentration can be made uniform within the wafer W.

Further, when the temperature of the treatment gas is high, the motion of the solvent molecules in the treatment gas is active. When there is a difference between the temperature of the treatment gas and the temperature of the wafer W, the temperature of the treatment gas approaches to the temperature of the wafer W as it is closer to the downstream side. When the temperature of the treatment gas is low, the motion of the molecules is suppressed near the gas discharge ports and becomes active at the downstream. As the temperature is higher, the probability of the molecules colliding with the resist pattern increases, so that the swelling amount varies on the gas discharge port side and the exhaust port side. In other words, by controlling the temperature of the treatment gas, the swelling amount can be adjusted between the gas discharge port side and the exhaust port side in each embodiment.

Though the discharge ports for the treatment gas and the discharge ports for the drying gas are shared in each of the above-described embodiments, these discharge ports may be separately formed because the effects of the present invention can be achieved as long as the flowing direction of the treatment gas and the flowing direction of the drying gas are the same. Further, each treatment container may be evacuated into a vacuum atmosphere, and each of the gases may be supplied into the vacuum atmosphere. Further, when the treatment gas and the drying gas are supplied from the center portion of the wafer W to the peripheral portion, the exhaust ports are not limited to those provided around the entire circumference of the wafer W as in the first and second embodiments, but the exhaust ports may be provided on one end side and the other end side of the wafer W so that the gases are exhausted from the one end side and the other end side.

[Evaluation Test]

Next, evaluation tests carried out relating to the present invention will be described. At a plurality of places along the diameter direction of the wafer W (assumed to be a wafer A1) on which a resist pattern was formed, the variation (LWR) in measured dimension of the resist pattern was measured. The LWR is indicated by three times a standard deviation of the variation (three sigma). Further, wafers A2, A3 on each of which a resist pattern was formed similarly to the wafer A1 were prepared. The wafer A2 was treated according to the first embodiment and measured similarly to the wafer A1, and the three sigma of the roughness of the resist pattern at each portion was calculated. Further, as for the wafer A3, the wafer W was continuously supplied with the treatment gas for a predetermined time without using the method of the present invention and then subjected to heat treatment, and the three sigma at each portion was calculated as with the wafers A1, A2.

Figure 29:
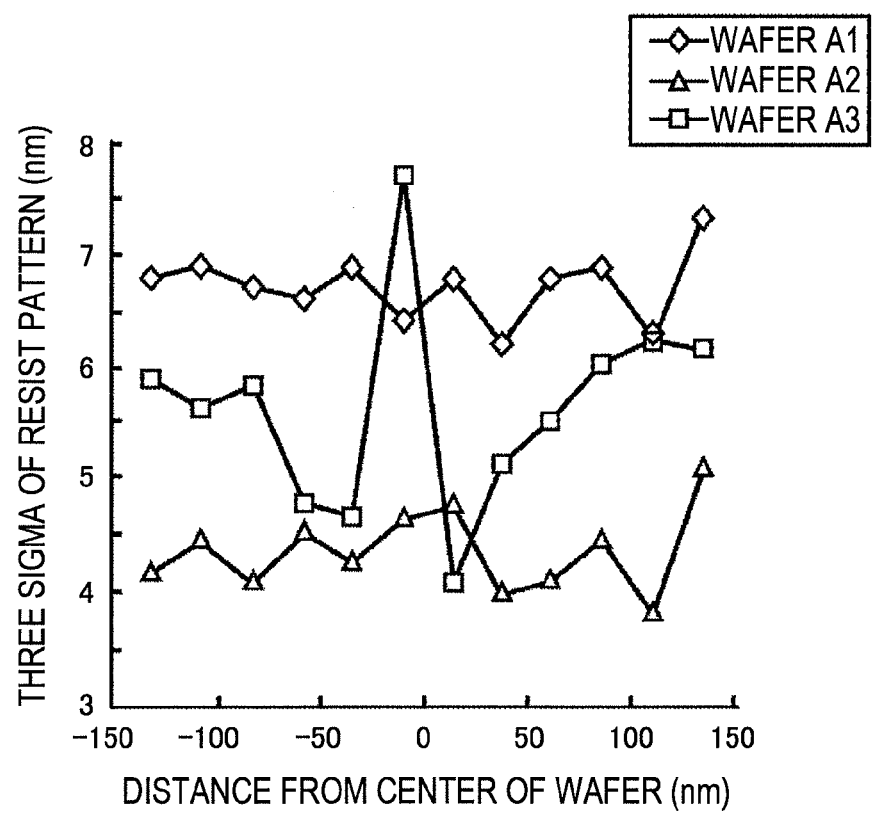
FIG. 29 is a graph chart presenting results of evaluation tests.

Graphs in FIG. 29 represent the results of the evaluation tests. The horizontal axis indicates the measurement position of the wafer W. On the horizontal axis, −150, +150 represent one end and the other end of the wafer W respectively, and 0 represents the center of the wafer W. The vertical axis indicates the calculated three sigma and its unit is nm. As represented by the graphs, the wafer A2 has a low three sigma at each measurement place as compared to the wafer A1. In other words, the variation in roughness of the resist pattern is small within the wafer W. Further, the value of the three sigma at the center portion of the wafer W in the wafer A3 was higher than the value in the wafer A1. This is because dissolution of the resist pattern occurred at the center portion of the wafer A3. The results of the evaluation tests show that the method of the present invention is effective to improve the roughness of the resist pattern with high uniformity within the wafer W.

What is claimed is:

1. A substrate treatment apparatus for performing treatment on a substrate on which a resist pattern mask has been formed by exposure and developing treatment to improve roughness of the resist pattern mask, said apparatus comprising:
    a treatment container including a lid body which includes a side wall part forming a peripheral edge portion of the lid body and an upper wall part surrounded by the side wall part;
    a gas supply part provided in a center portion on a rear surface side of the upper wall part;
    a stage provided in said treatment container;
    a solvent gas supply part for supplying a solvent gas for swelling the resist pattern mask, from the gas supply part to the substrate mounted on said stage;
    a drying gas supply part, for supplying a drying gas for drying the solvent supplied to the substrate, from the gas supply part to the substrate mounted on said stage;
    an exhaust port provided in a lower end of the side wall part for exhausting the solvent gas and the drying gas; and
    a control unit for outputting a control signal for controlling supply of the solvent gas by said solvent gas supply part, supply of the drying gas by said drying gas supply part, and exhaust from said exhaust port,
    wherein said control unit outputs the control signal to repeat a plurality of times steps of supplying the solvent gas from the gas supply part to the substrate while exhausting the solvent gas from the exhaust port, and then supplying the drying gas from the gas supply part to the substrate while exhausting the drying gas from the exhaust port.

2. The substrate treatment apparatus as set forth in claim 1, wherein said stage comprises a temperature adjusting mechanism for adjusting a temperature of the substrate.

3. The substrate treatment apparatus as set forth in claim 1, wherein said heating plate comprises a first heating plate for transferring in/out a first substrate and a second heating plate for transferring in/out a second substrate, wherein while the solvent gas and the drying gas are supplied to the first substrate, said second heating plate heats the second substrate transferred to the outside of said treatment container, and wherein while the solvent gas and the drying gas are supplied to the second substrate, said first heating plate heats the first substrate transferred to the outside of said treatment container.

4. A substrate treatment apparatus for performing treatment on a substrate on which a resist pattern mask has been formed by exposure and developing treatment to improve roughness of the resist pattern mask, said apparatus comprising:

a treatment container including a lid body which includes a side wall part forming a peripheral edge portion of the lid body and an upper wall part surrounded by the side wall part;

a ring-shaped gas supply port provided in the side wall part;

a stage provided in said treatment container; a heating plate for transferring the substrate to/from an inside of said treatment container and heating the substrate;

a solvent gas supply part, for supplying a solvent gas for swelling the resist pattern mask, from the gas supply port to the substrate mounted on said stage;

a drying gas supply part, for supplying a drying gas for drying the solvent supplied to the substrate, from the gas supply port to the substrate mounted on said stage;

an exhaust port provided in a center portion on a rear surface side of the upper wall part for exhausting the solvent gas and the drying gas; and a control unit for outputting a control signal for controlling supply of the solvent gas by said solvent gas supply part, supply of the drying gas by said drying gas supply part, and exhaust from said exhaust port, wherein said control unit outputs the control signal to repeat a plurality of times steps of supplying the solvent gas from the gas supply port to the substrate while exhausting the solvent gas from the exhaust port, and then supplying the drying gas from the gas supply port to the substrate while exhausting the drying gas from the exhaust port.

5. The substrate treatment apparatus as set forth in claim 4, wherein said stage comprises a temperature adjusting mechanism for adjusting a temperature of the substrate.

6. The substrate treatment apparatus as set forth in claim 4, wherein said heating plate comprises a first heating plate for transferring in/out a first substrate and a second heating plate for transferring in/out a second substrate, wherein while the solvent gas and the drying gas are supplied to the first substrate, said second heating plate heats the second substrate transferred to the outside of said treatment container, and wherein while the solvent gas and the drying gas are supplied to the second substrate, said first heating plate heats the first substrate transferred to the outside of said treatment container.

7. A substrate treatment apparatus for performing treatment on a substrate on which a resist pattern mask has been formed by exposure and developing treatment to improve roughness of the resist pattern mask, said apparatus comprising:

a treatment container;

a stage provided in said treatment container; a heating plate for transferring the substrate to/from an inside of said treatment container and heating the substrate;

a solvent gas supply part, provided at one end side of the stage, for supplying a solvent gas for swelling the resist pattern mask to the substrate mounted on said stage;

a drying gas supply part, provided at the one end side of the stage, for supplying a drying gas for drying the solvent supplied to the substrate to the substrate mounted on said stage;

an exhaust port, provided at another end side opposite to the one end side of the stage, for exhausting the solvent gas and the drying gas; and a control unit for outputting a control signal for controlling supply of the solvent gas by said solvent gas supply part, supply of the drying gas by said drying gas supply part, and exhaust from said exhaust port, wherein said control unit outputs the control signal to repeat a plurality of times steps of supplying the solvent gas from the one end side of the stage to the substrate while exhausting the solvent gas from the another end side of the stage, and then supplying the drying gas from the one end side of the stage to the substrate while exhausting the drying gas from the another end side of the stage.

8. The substrate treatment apparatus as set forth in claim 7, wherein said stage comprises a temperature adjusting mechanism for adjusting a temperature of the substrate.

9. The substrate treatment apparatus as set forth in claim 7, wherein said heating plate comprises a first heating plate for transferring in/out a first substrate and a second heating plate for transferring in/out a second substrate, wherein while the solvent gas and the drying gas are supplied to the first substrate, said second heating plate heats the second substrate transferred to the outside of said treatment container, and wherein while the solvent gas and the drying gas are supplied to the second substrate, said first heating plate heats the first substrate transferred to the outside of said treatment container.

* * * * *